(12) United States Patent
Yang et al.

(10) Patent No.: US 7,915,118 B2
(45) Date of Patent: Mar. 29, 2011

(54) NONVOLATILE MEMORY DEVICES AND METHODS OF FABRICATING THE SAME

(75) Inventors: Bong-gil Yang, Suwon-si (KR);
Jung-sup Uom, Suwon-si (KR);
Sup-youl Ju, Seongnam-si (KR);
Se-jong Park, Seoul (KR); Hyun-sug Han, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1134 days.

(21) Appl. No.: 11/634,879

(22) Filed: Dec. 7, 2006

(65) Prior Publication Data

US 2008/0099822 A1    May 1, 2008

(30) Foreign Application Priority Data

Nov. 1, 2006    (KR) .................. 10-2006-0107326

(51) Int. Cl.
*H01L 21/336* (2006.01)
(52) U.S. Cl. .................. 438/257; 257/E21.68
(58) Field of Classification Search .......... 438/257–267; 257/314–320, E21.679, E21.68, E21.687, 257/E21.688
See application file for complete search history.

(56) References Cited

U.S. PATENT DOCUMENTS

| | | | | |
|---|---|---|---|---|
| 6,153,904 A | * | 11/2000 | Yang | 257/316 |
| 6,200,860 B1 | * | 3/2001 | Chiang et al. | 438/266 |
| 6,495,420 B2 | * | 12/2002 | Tseng | 438/267 |
| 6,617,638 B2 | | 9/2003 | Chiang et al. | |
| 6,635,922 B1 | | 10/2003 | Hsieh et al. | |
| 6,759,709 B1 | | 7/2004 | Shimizu | |
| 6,872,623 B2 | * | 3/2005 | Chuang et al. | 438/257 |
| 6,921,694 B2 | | 7/2005 | Chuang et al. | |
| 6,943,403 B2 | | 9/2005 | Park | |
| 7,151,295 B2 | | 12/2006 | Yaegashi et al. | |

FOREIGN PATENT DOCUMENTS

| | | |
|---|---|---|
| KR | 1997-0060501 | 8/1997 |
| KR | 1997-0060502 | 8/1997 |
| KR | 10-2001-0028985 A | 4/2001 |
| KR | 10-2004-0055172 A | 6/2004 |
| KR | 10-2004-0069944 A | 8/2004 |
| KR | 10-2005-0020042 | 3/2005 |
| KR | 10-2006-0029772 A | 4/2006 |
| KR | 10-2006-0046069 A | 5/2006 |

* cited by examiner

*Primary Examiner* — Brook Kebede
(74) *Attorney, Agent, or Firm* — Lee & Morse, P.C.

(57) ABSTRACT

A nonvolatile memory device may include a semiconductor substrate, a floating gate electrode on the semiconductor substrate that includes an acute-angled tip at an upper end, and a control gate electrode insulated from the floating gate electrode and facing at least a portion of the floating gate electrode, wherein an angle formed between the semiconductor substrate and an upper portion of a lateral surface of the floating gate electrode is smaller than an angle formed between the semiconductor substrate and a lower portion of the lateral surface of the floating gate electrode.

13 Claims, 10 Drawing Sheets

NONVOLATILE MEMORY DEVICES AND METHODS OF FABRICATING THE SAME

BACKGROUND OF THE INVENTION

1. Field of the Invention

The present invention relates to a nonvolatile memory device and a method of fabricating the same. More particularly, the present invention relates to a nonvolatile memory device including a floating gate electrode with an acute-angled tip and a method of fabricating the same.

2. Description of the Related Art

Memory devices are widely used in micro controllers, credit cards, etc. Memory devices may be classified into volatile memory devices and nonvolatile memory devices. In general, volatile memory devices, e.g., DRAM and SRAM, are advantageous with regard to rapid input and output of data, but are disadvantageous because data may be lost after a predetermined time. In general, nonvolatile memory devices, e.g., ROM, are disadvantageous because data input and output may be slow, but are advantageous in that data may be stored for data storage capabilities. Recently, EEPROMs, flash memory devices, etc. are being developed as nonvolatile memory devices that are capable of electrically inputting and outputting data.

EEPROMs or flash memory devices may be classified as a stack gate type and a split gate type. In a memory device of a double split gate type, data is electrically programmed by a Channel Hot Electron Injection method, and erased by an F-N (Fowler-Nordheim) tunneling method. To erase data by the F-N tunneling method, a control gate requires a high voltage. With a demand for devices capable of operating with a reduced driving voltage, a method of forming an acute-angled tip at a floating gate electrode has been studied. However, it is difficult to effectively form a floating gate electrode having a tip with a small inner angle while suppressing side effects like reverse tunneling at the same time.

In the meantime, as the demand for highly integrated chips is increasing, an interval between floating gate electrodes for each cell in the nonvolatile memory device is narrowing. However, as the interval between floating gate electrodes becomes narrow, it is likely that bridges are formed between different cells, leading to reduced device reliability. Therefore, it is necessary to reliably control a position and size of floating gate electrodes.

SUMMARY OF THE INVENTION

The present invention is therefore directed to nonvolatile memory devices and methods of manufacturing nonvolatile memory devices, which substantially overcome one or more of the problems due to limitations and disadvantages of the related art.

It is therefore a feature of an embodiment of the invention to provide a nonvolatile memory device that includes a floating gate electrode having a tip with a small inner angle.

It is therefore a separate feature of an embodiment of the invention to provide method of manufacturing a nonvolatile memory device that can reliably control a width of a floating gate electrode.

It is therefore a separate feature of an embodiment of the invention to provide a nonvolatile memory device including a floating gate electrode shaped so as to enable high data erasing efficiency.

It is therefore a separate feature of an embodiment of the invention to provide a nonvolatile memory device including a floating gate electrode shaped so as to prevent and/or reduce reverse tunneling.

It is therefore a separate feature of an embodiment of the invention to provide a method of manufacturing a memory device that may enable a maximum width of a floating gate electrode to be easily controlled.

It is therefore a separate feature of an embodiment of the invention to provide a method of manufacturing a memory device that may easily prevent bridges from being formed between floating electrodes of adjacent cells.

At least one of the above and other features and advantages of the present invention may be realized by providing a nonvolatile memory device, including a semiconductor substrate, a floating gate electrode on the semiconductor substrate, and including an acute-angled tip at an upper end; and a control gate electrode insulated from the floating gate electrode and facing at least a portion of the floating gate electrode, wherein an angle formed between the semiconductor substrate and an upper portion of a lateral surface of the floating gate electrode is smaller than an angle formed between the semiconductor substrate and a lower portion of the lateral surface of the floating gate electrode.

The lower portion of the lateral surface of the floating gate electrode may be recessed inward with respect to the acute-angled tip. The lateral surface of the floating gate electrode may have a concave curved shape, and a radius of curvature of the upper portion of the lateral surface may be smaller than a radius of curvature of the lower portion of the lateral surface.

The lateral surface of the floating gate electrode may include a concave curved section at the upper portion thereof and a straight section at the lower portion thereof. The lateral surface of the floating gate electrode may include a straight section at the upper portion thereof and a concave curved section at the lower portion thereof.

The lateral surface of the floating gate electrode may include a first straight section at the upper portion thereof and a second straight section at the lower portion thereof. An angle formed between the semiconductor substrate and the lower portion of the lateral surface of the floating gate electrode may be about 90°.

The control gate electrode may at least partially overlap an upper surface of the floating gate electrode and the lateral surface of the floating gate electrode. The memory device may include a first gate insulating film interposed between the semiconductor substrate and the control gate electrode and between the semiconductor substrate and the floating gate electrode, a second gate insulating film interposed between the lateral surface of the floating gate electrode and the control gate electrode, and an isolation oxide film covering the upper surface of the floating gate electrode.

At least one of the above and other features and advantages of the present invention may be separately realized by providing a method of fabricating a nonvolatile memory device, the method including forming a floating gate electrode on a semiconductor substrate, the floating gate electrode including an acute-angled tip at an upper end, and forming a control gate electrode insulated from the floating gate electrode, and facing at least a portion of the floating gate electrode, wherein an angle formed between the semiconductor substrate and an upper portion of a lateral surface of the floating gate electrode may be smaller than an angle formed between the semiconductor substrate and a lower portion of the lateral surface of the floating gate electrode.

The lower portion of the lateral surface of the floating gate electrode may be recessed inward with respect to the acute-angled tip. Forming the floating gate electrode may include forming a sacrificial film having an opening on the semiconductor substrate, forming a sacrificial spacer on a side of the opening, forming a floating gate conductive film inside the opening where the sacrificial spacer is formed, and removing the sacrificial film and the sacrificial spacer.

A lateral surface of the sacrificial spacer may be formed in a convex curved shape, a radius of curvature of an upper portion of the lateral surface of the sacrificial spacer may be smaller than a radius of curvature of a lower portion of the lateral surface thereof, the lateral surface of the floating gate electrode may be formed in a concave curved shape, and a radius of curvature of the upper portion of the lateral surface of the floating gate electrode may be smaller than a radius of curvature of the lower portion of the lateral surface of the floating gate electrode.

A lateral surface of the sacrificial spacer may include a convex curved section at the upper portion thereof and a straight section at the lower portion thereof, and the lateral surface of the floating gate electrode may include a concave curved section at the upper portion thereof and a straight section at the lower portion thereof. An angle formed between the semiconductor substrate and the lower portion of a lateral surface of the sacrificial spacer may be about 90°, and an angle formed between the semiconductor substrate and the lower portion of the lateral surface of the floating gate electrode may be about 90°.

The method may include forming a mask film through which the opening is exposed on the sacrificial film, wherein the mask film on the sacrificial film may be removed during the formation of the floating gate conductive film. The sacrificial spacer may include a silicon nitride film, and the mask film may include polysilicon.

The method may include oxidizing an upper surface of the floating gate conductive film formed inside the opening. The method may include forming a first gate insulating film on the semiconductor substrate before forming the floating gate electrode, and forming a second gate insulating film on an exposed lateral surface of the floating gate electrode after forming the floating gate electrode. Removing the sacrificial film and the sacrificial spacer may include performing a wet etching method.

Features and advantages of the present invention are not limited to those mentioned above, and other features and advantages of the present invention will be apparently understood by those skilled in the art through the following description.

Details of other aspects of the invention are included in the detailed description and the drawings.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
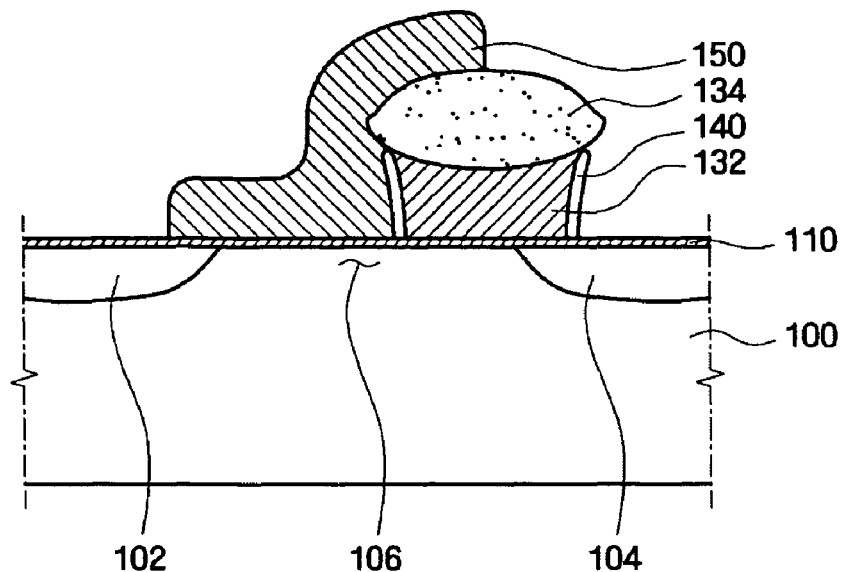
FIG. 1 illustrates a cross-sectional view of a nonvolatile memory device according to an exemplary embodiment of the present invention.

Korean Patent Application No. 10-2006-0107326 filed on Nov. 1, 2006 in the Korean Intellectual Property Office, and entitled: "Nonvolatile Memory Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims.

In the following description of exemplary embodiments of the present invention, a detailed description of known device structures and techniques that may be incorporated therein will be omitted when it may make the subject matter of the present invention unclear.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a nonvolatile memory device according to preferred embodiments of the invention will be described with reference to the accompanying drawings.

FIG. 1 illustrates a cross-sectional view of a nonvolatile memory device according to an exemplary embodiment of the present invention.

Referring to FIG. 1, the nonvolatile memory device according to the embodiment of the invention may include a floating gate electrode 132 and a control gate electrode 150 formed on a semiconductor substrate 100. In the semiconductor substrate 100, first and second source/drain regions 102 and 104 may be formed, and a channel region 106 may be defined between the pair of first and second source/drain regions 102 and 104. The floating gate electrode 132 may be positioned to partially overlap with the channel region 106 of the semiconductor substrate 100. The control gate electrode 150 may partially overlap with at least a portion of the channel region 106 of the semiconductor substrate 100, and a portion of the control gate electrode 150 may face at least a portion of the floating gate electrode 132. That is, e.g., at least a portion of the control gate 150 may overlap the channel region 106 without the floating gate electrode 132 therebetween and another portion of the control gate 150 may overlap the channel region 106 with the floating gate electrode 132 therebetween.

In some embodiments of the invention, the semiconductor substrate 100 may be formed of one or more of, e.g. Si, Ge, SiGe, GaP, GaAs, SiC, SiGeC, InAs, InP, etc.

The first and second source/drain regions 102 and 104 may be highly doped with n-type impurities or p-type impurities, and may be disposed on the semiconductor substrate 100 so as to be separated from each other.

The channel region 106 may be located between a pair of the first and second source/drain regions 102 and 104. The channel region 106 may include p-type impurities or n-type impurities. However, a doping concentration of the impurities included in the channel region 106 may be smaller than a doping concentration of the first and second source/drain regions 102 and 104. Further, a type of impurity(ies) doped in the channel region 106 may be different from the type of impurity(ies) included in the first and second source/drain regions 102 and 104. Therefore, e.g., if the first and second source/drain regions 102 and 104 include n-type impurities, the channel region 106 may include p-type impurities.

A first gate insulating film 110 may be formed on the semiconductor substrate 100, e.g., an entire surface of the semiconductor substrate 100. The first gate insulating film 110 may be formed of a silicon oxide film, a silicon nitride film, a silicon oxynitride film, etc. In addition, the first gate insulating film 110 may be formed of high dielectric material, i.e., high-k material, such as aluminum oxide (AlOx), hafnium oxide (HfOx), etc. Modifications of the present embodiment include, e.g., the case in which the first gate insulating film 110 may be formed of a mixture of the above-described film or materials.

At least a portion of the floating gate electrode 132 may overlap at least a portion of the channel region 106. The first gate insulating film 110 may be interposed between the floating gate electrode 132 and the channel region 106. Another portion of the floating gate electrode 132 may overlap the second source/drain region 104, with the first gate insulating film 110 interposed therebetween. In some embodiments of the invention, only the first gate insulating film 110 may be interposed between the floating gate electrode 132 and the channel region 106 or the second source/drain region 104.

One or more sides of the floating gate electrode 132 may have a concave shape. For example, as shown in FIG. 1, each side, e.g., upper side and lateral sides, of the floating gate electrode 132, except for a lower side of the floating gate electrode 132 may have a concave shape. Acute-angled tips may be formed at both edges of the upper side of the floating gate electrode 132. The shape of the floating gate electrode 132 will be described in a greater detail hereafter.

In the following description, the upper side may correspond to a side of a layer, e.g., floating gate electrode 132, including a furthest point of the layer relative to the semiconductor substrate 100, the lower side may correspond to a side of a layer, e.g., floating gate electrode 132, including a closest point of the layer relative to the semiconductor substrate, and a lateral side of a layer, e.g., floating gate electrode 132, may correspond to sides connecting, i.e., extending between, upper and lower sides of the layer.

The floating gate electrode 132 may be formed of, e.g., a single film or a laminated film of conductive material, e.g., polysilicon, metal and/or metal silicide. In embodiments in which polysilicon is used in the floating gate electrode 132, the polysilicon may be doped with n-type or p-type impurities so as to have sufficient conductivity.

A second gate insulating film 140 may be formed on lateral surfaces of the floating gate electrode 132. The second gate insulating film 140 may be formed of, e.g., a silicon oxide film, a silicon nitride film, and a silicon oxynitride film. The second gate insulating film 140 may be formed of high dielectric material, i.e., a high-k material, such as aluminum oxide (AlOx), hafnium oxide (HfOx), etc. Modifications of the present embodiment include, e.g., the case in which the second gate insulating film 140 is formed of a mixture of the above-described film or materials.

An isolation oxide film 134 may be formed on an upper surface of the floating gate electrode 132. One or more sides of the isolation oxide film 134 may have a convex shape. For example, the isolation oxide film 134 may include convex upper and lower surfaces. As shown in FIG. 1, e.g., the isolation oxide film 134 may be tapered at end portions thereof and the upper surface may meet the lower surface, i.e., the isolation oxide film 134 may not include lateral surfaces connecting the upper and lower surfaces.

The isolation oxide film 134 may be formed of oxide, which may be a main material of the floating gate electrode 132 that may be provided at the lower side of the isolation oxide film 134. For example, if the floating gate electrode 132 is formed of polysilicon, the isolation oxide film 134 may be formed of silicon oxide.

The first gate insulating film 110, the second gate insulating film 140, and the isolation oxide film 134 may surround the floating gate electrode 132. More particularly, in some embodiments of the invention, the first gate insulating film 110, the second gate insulating film 140 and the isolation oxide film 134 may completely surround all sides of the floating gate electrode 132. In such embodiments, e.g., the first gate insulating film 110 may cover the lower surface of the floating gate electrode 132, the second gate insulating film 140 may cover the lateral surface(s) of the floating gate electrode 132, and the isolation oxide film 134 may cover the upper surface of the floating gate electrode 132. In embodiments of the invention, the floating gate electrode 132 may be electrically floating.

At least a portion of the control gate electrode 150 may overlap at least a portion of the channel region 106. One or more layers may be interposed between the portion of the control gate electrode 150 and the semiconductor substrate 100 and a different layer(s) may be interposed between different portions of the control gate electrode 150 and the semiconductor substrate 100. Another portion, e.g., a remaining portion, of the control gate electrode 150 may overlap a portion of the first source/drain region, e.g., 102, which does not overlap the floating gate electrode 132. The first gate insulating film 110 may be interposed between the control gate electrode 150 and the semiconductor substrate 100 and/or the first source/drain region 102. In some embodiments of the invention, a portion of the channel region 106 may overlap the floating gate electrode 132, another portion of the channel region may overlap the control gate electrode 150 and/or another portion of the channel region 106 may overlap both the control gate 150 and the floating gate electrode 132. In some embodiments of the invention, other than the second gate insulating film(s) 140, a combination of the floating gate electrode 132 and the control gate electrode 150 may substantially or completely overlap the channel region 106 with the first gate insulating film 110 therebetween. More particularly, in embodiments of the invention, respective portions of the floating gate insulating film(s) 140, the floating gate electrode 132 and the control gate electrode 150 may substantially or completely overlap the channel region 106 with only the first gate insulating film 110 therebetween.

A portion(s) of the control gate electrode 150 may overlap the first source/drain region 102 with the first gate insulating film 110 interposed therebetween. The first source/drain region 102 overlapping with the control gate electrode 150 may be provided on a side of the channel region 106 substantially opposite to a side of the channel region where the portion of the floating gate electrode 132 may overlap the second source/drain region 104.

The control gate electrode 150 may face at least a portion of the floating gate electrode 132. The control gate electrode 150 may have a step-like cross-sectional shape, as shown in FIG. 1. In such embodiments, the control gate electrode 150 may overlap a lateral surface of the floating gate electrode 132 with the second gate insulating film 140 interposed therebetween, and/or the upper surface of the isolation oxide film 134. The control gate electrode 150 may directly overlap respective portion(s) of the isolation oxide film 134.

More particularly, in embodiments of the invention, the control gate electrode 150 may be formed to overlap a tip, e.g., an upper tip, of the floating gate electrode 132. To ensure this, in such embodiments, e.g., the control gate electrode 150 may extend at least up to the upper surface of the floating gate electrode 132. That is, e.g., the control gate electrode 150 may overlap with at least a portion of the upper surface floating gate electrode 132 with the isolation oxide film 134 interposed therebetween.

The control gate electrode 150 may be formed of a single film or a laminated film of conductive material, e.g., polysilicon, metal, and metal silicide.

Figure 2:
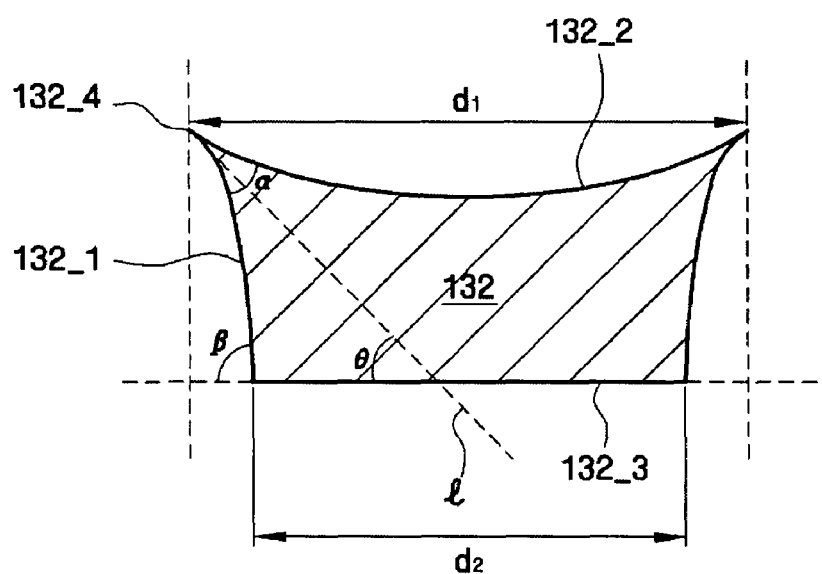
FIG. 2 illustrates a cross-sectional view of a lateral side of a first exemplary embodiment of the floating gate electrode illustrated in FIG. 1 employing one or more aspects of the invention.

FIG. 2 illustrates a cross-sectional view of a lateral side of a first exemplary embodiment of the floating gate electrode illustrated in FIG. 1 employing one or more aspects of the invention.

Referring to FIGS. 1 and 2, the floating gate electrode 132 may have concave lateral surfaces 132_1 and a concave upper surface 132_2, taken as a whole. Therefore, the floating gate electrode 132 may have an acute-angled tip 132_4 at regions where the concave lateral surfaces 132_1 meet the concave upper surface 132_2, i.e., at upper edges of the floating gate electrode 132.

The floating gate electrode 132 may have a shape that tapers from the upper side to the lower side, taken as a whole. That is, e.g., a lower side of the lateral surface 132_1 of the floating gate electrode may be recessed inward with respect to the acute-angled tip 132_4 of the upper side. Therefore, a width d2 of the lower surface 132_3 of the floating gate electrode may be smaller than a distance d1 between the acute-angled tips 132_4 provided at both edges of the upper side (d1>d2). In some embodiments of the invention, e.g., the width d2 of the lower surface 132_3 of the floating gate electrode may have a minimum value of the transverse width of the entire floating gate electrode 132.

Because the lateral surface 132_1 of the floating gate electrode may have a concave shape, taken as a whole, an angle θ formed between the semiconductor substrate 100 or a horizontal surface and a tangent line I at an upper portion of the lateral surface 132_1 of the floating gate electrode 132 may be smaller than an angle β formed between the semiconductor substrate 100 and a lower portion of the lateral surface 132_1 of the floating gate electrode 132 (β>θ). Therefore, to reduce an inner angle α of the tip 132_4, the lower potion of the lateral surface 132_1 may be less inclined or may be substantially vertical, e.g., perpendicular to the semiconductor substrate 100, while the upper portion of the lateral surface 132_1 may be more inclined. If the inner angle α of the tip 132_4 is small, electrons may concentrate around the tip 132_4. Accordingly, electrons held by the floating gate electrode 132 may easily exit from the floating gate electrode toward the control gate electrode (150 of FIG. 1). If the lower portion of the lateral surface 132_1 of the floating gate electrode 132 is barely inclined or substantially vertical, effects of reverse tunneling of electrons from the control gate electrode (150 of FIG. 1) to the floating gate electrode 132 may occur. A more detailed description of such possible effects will be described below.

FIGS. 3A to 3D illustrate cross-sectional views of a lateral side of second to fifth exemplary embodiments of a floating gate electrode employing one or more aspects of the invention. More particularly, FIGS. 3A to 3D only illustrate exemplary embodiments of the floating gate electrode 132a to 132d. As any of the other exemplary embodiments may be substituted for the exemplary embodiment of the floating gate electrode 132 illustrated in FIG. 1, aspects of the exemplary embodiments illustrated in FIGS. 3A to 3D may be described in relation to features illustrated and described in FIG. 1.

Figure 3A:
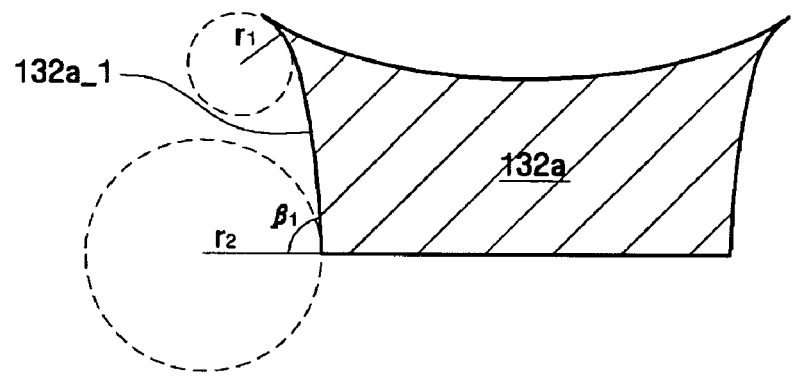
FIGS. 3A to 3D illustrate cross-sectional views of a lateral side of second to fifth exemplary embodiments of a floating gate electrode employing one or more aspects of the invention.

In the second exemplary embodiment illustrated in FIG. 3A, a lateral surface of the floating gate electrode 132a may have a concave curved shape, taken as a whole. In such embodiments, an angle formed between a lower portion of the lateral surface of the floating gate electrode 132a_1 and a horizontal surface, e.g., the semiconductor substrate 100, may be between 0° and 90°. More particularly, in some embodiments of the invention, an angle β1 between the lower portion of the lateral surface 132a_1 and a lower surface of the floating gate electrode 132a adjacent to the semiconductor substrate 100 or the semiconductor substrate 100 may be about 90°. To make an inner angle of a respective tip sufficiently small, as shown in FIG. 3A, a radius of curvature r1 at an upper portion lateral surface 132a_1 of the floating gate electrode 132a may be smaller than a radius of curvature r2 at a lower portion of the lateral surface 132a_1 of the floating gate electrode 132a.

Figure 3B:
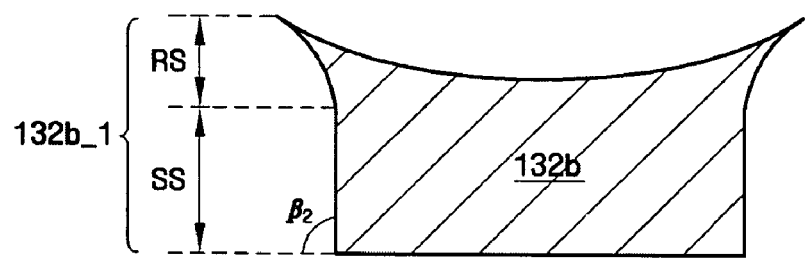

FIG. 3B illustrates the third exemplary embodiment in which a lateral surface 132b_1 of the floating gate electrode 132b may include a concave curved section RS at an upper portion thereof and a straight section SS at lower portion thereof. In some embodiments of the invention, an angle β2 between the straight section SS at the lower portion thereof and the semiconductor substrate 100 may be about 90°.

Figure 3C:
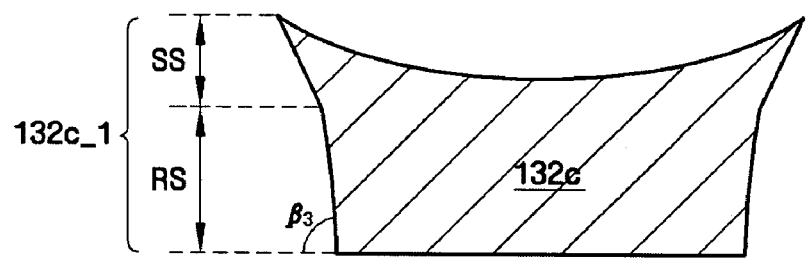

FIG. 3C illustrates the fourth exemplary embodiment in which a lateral surface 132c_1 of the floating gate electrode 132c may include a straight section SS at an upper portion thereof and a concave curved section RS at a lower portion thereof. In some embodiments of the invention, an angle β3 between a lower portion of the curved section RS adjacent to the semiconductor substrate 100 and the semiconductor substrate 100 may be about 90°.

Figure 3D:
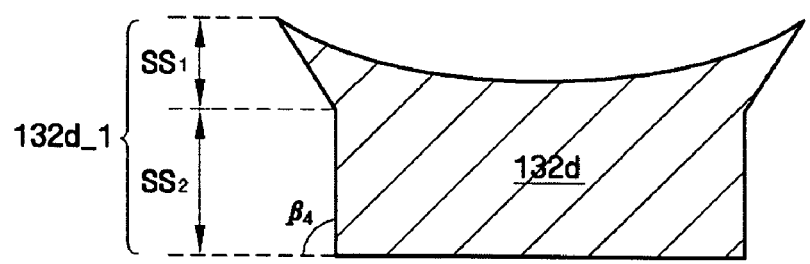

FIG. 3D illustrates a fifth exemplary embodiment in which a lateral surface 132d_1 of the floating gate electrode 132d may include a first straight section SS1 at an upper portion thereof and a second straight section SS2 at a lower portion thereof. In some embodiments of the invention, an angle formed between the first straight section SS1 and the semiconductor substrate 100 may be larger than an angle β4 formed between the second straight section SS2 and the semiconductor substrate 100. The angle β4 formed between the second straight section SS2 and the semiconductor substrate 100 may be about 90°.

Various exemplary features of a floating gate electrode employing one or more aspects of the invention will be described below. The semiconductor substrate 100 may inject electrons into the floating gate electrode 132, 132a to 132d in accordance with voltages applied to the control gate electrode 150, and the first and second source/drain regions 102, 104 and the floating gate electrode 132, 132a to 132d may hold the electrons, and may discharge the electrons to the control gate electrode 150 or the like. Further, different data values may be read according to whether the electrons are held or discharged. Hereinafter, an exemplary operation of the nonvolatile memory device illustrated in FIGS. 1 and 2 will be described.

To program data, a high voltage may be applied to the control gate electrode 150. Then, a predetermined coupling voltage may be induced to the floating gate electrode 132 overlapping the control gate electrode 150. If the high voltage applied to the control gate electrode 150 and the coupling voltage induced to the floating gate electrode 132 are larger than a threshold voltage, a lower channel region 106 may be turned on.

In such cases, if a relatively low voltage is applied to the first source/drain region 102, and a relatively high voltage is applied to the second source/drain region 104, electrons may move along the turned on channel region 106 from the first source/drain region 102 to the second source/drain region 104. When the electrons moving along the channel region 106 reach the second source/drain region 104, the electrons may gain energy due to acceleration, collision between atoms and/or other reasons. Some or all of the electrons in the channel region that have gained energy as described above may pass through the first gate insulating film 110 by a CHEI (Channel Hot Electron Injection) method so as to be injected to the floating gate electrode 132. In this way, programming of data may be performed.

Erasing of data may be performed by an F-N (Fowler-Nordheim) tunneling method. For example, if a ground voltage is applied to the first source/drain region 102 and the second source/drain region 104, and a high voltage is applied to the control gate electrode 150, electrons held by the floating gate electrode 132 may be F-N tunneled toward the second gate insulating film 140 so as to be discharged toward the control gate electrode 150. Although an acute-angled tip 132_4 may be provided at both edges of the upper side of the floating gate electrode 132, because of the high voltage applied to the control gate electrode 150, electrons may mainly concentrate at the acute-angled tip 132_4 adjacent to the control gate electrode 150. Thus, the electrons held by the floating gate electrode 132 may be mainly tunneled from the tip 132_4 thereof adjacent to the control gate electrode 150. More particularly, because the inner angle α of the tip 132_4 may be small, electrons may be more likely to concentrate on the tip 132_4. If the electrons greatly concentrate at the tip 132_4, F-N tunneling efficiency of electrons may be relatively high and/or voltages required for F-N tunneling may be relatively lower.

However, as described above, because the nonvolatile memory device of FIG. 1 may be capable of selectively decreasing an inclination of the upper portion of the lateral surface 132_1 of the floating gate electrode 132, the inner angle α of the tip 132_4 may be made smaller. Therefore, in the nonvolatile memory device of FIG. 1, data erasing efficiency may be high and/or a driving voltage may be made low.

Although the lower portion of the lateral surface 132_1 of the floating gate electrode 132 may face or overlap the control gate electrode 150, if an inclination of the lower portion of the lateral surface 132_1 of the floating gate electrode 132 is small, the control gate electrode 150 may have an acute-angled tip at a corresponding lower portion thereof. Therefore, electrons may concentrate at the acute-angled tip provided at the lower side of the control gate electrode 150. However, if electrons concentrate at such an acute-angled tip of the control gate electrode 150, electrons may be reverse tunneled from the control gate electrode 150 to the floating gate electrode 132 or to the semiconductor substrate 100.

However, as described above, because the nonvolatile memory device of FIG. 1 may selectively maintain an inclination of the lower potion of the lateral surface 132_1 at a relatively large angle, e.g., about 90°, an acute-angled tip may not be formed at the lower side of the control gate electrode 150. Therefore, it is possible to prevent or reduce reverse tunneling at the lower portion of the control gate electrode 150.

Hereinafter, exemplary methods of fabricating the above-described nonvolatile memory device will be described. Features, e.g., material, dimension, use, etc. of elements described above in relation to FIGS. 1 to 3D and employable in and/or resulting from the exemplary methods are omitted or description thereof is simplified in the following description.

FIGS. 4 to 12 illustrate cross-sectional views of resulting structures obtained during an exemplary method of fabricating a nonvolatile memory device according to an embodiment of the invention.

Figure 4:
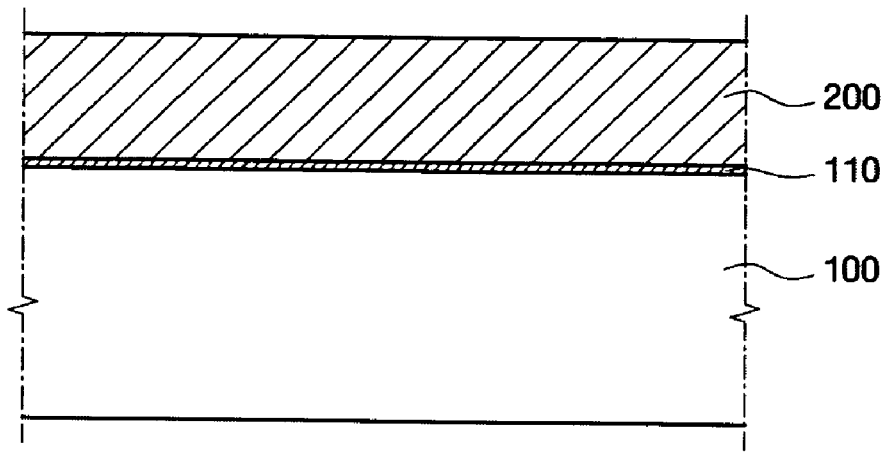
FIGS. 4 to 12 illustrate cross-sectional views of resulting structures obtained during an exemplary method of fabricating a nonvolatile memory device according to an embodiment of the invention.

Referring to FIG. 4, the first gate insulating film 110 and a sacrificial film 200 may be consecutively formed on the semiconductor substrate 100.

The first gate insulating film 110 may be formed by, e.g., a Chemical Vapor Deposition (CVD), a Low Pressure Chemical Vapor Deposition (LPCVD), a Plasma Enhanced Chemical Vapor Deposition (PECVD), or the like. If the first gate insulating film 110 is formed of a silicon oxide film, it can be formed by, e.g., thermal oxidation.

The sacrificial film 200 may be formed of, e.g., a silicon nitride film, a silicon oxynitride film, etc., but may be formed of a material that is different than a material of the first gate insulating film 110 formed at a lower side of the sacrificial film 200. In embodiments of the invention, the sacrificial film 200 may have a larger etching rate than the first gate insulating film 110 in relation to an etching gas that may be used in a subsequent process of etching the sacrificial film 200. In particular, for example, the first gate insulating film 110 may be a silicon oxide film, and the sacrificial film 200 may be a silicon nitride film.

Figure 5:
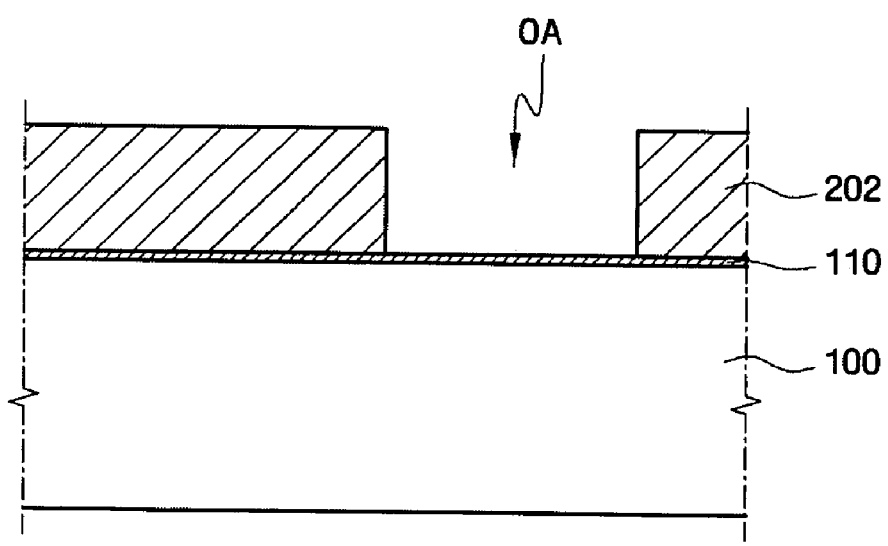

Referring to FIG. 5, the sacrificial film 200 may be patterned. The sacrificial film 200 may be patterned using, e.g., a photolithography process or the like. As described above, the etching process can be performed by using an etching gas with a larger etching rate of the sacrificial film 200 than the first gate insulating film 110.

The patterned sacrificial film 202 may include an opening OA through which the first gate insulating film 110 may be exposed. A position of the opening OA may correspond to an exposed area during the photolithography process. Because the opening OA may be at a region where the floating gate electrode 132 may be formed by a subsequent process, a mask determining the exposed area, e.g., opening OA, may be arranged corresponding to the region where the floating gate electrode 132 is to be formed.

Figure 6:
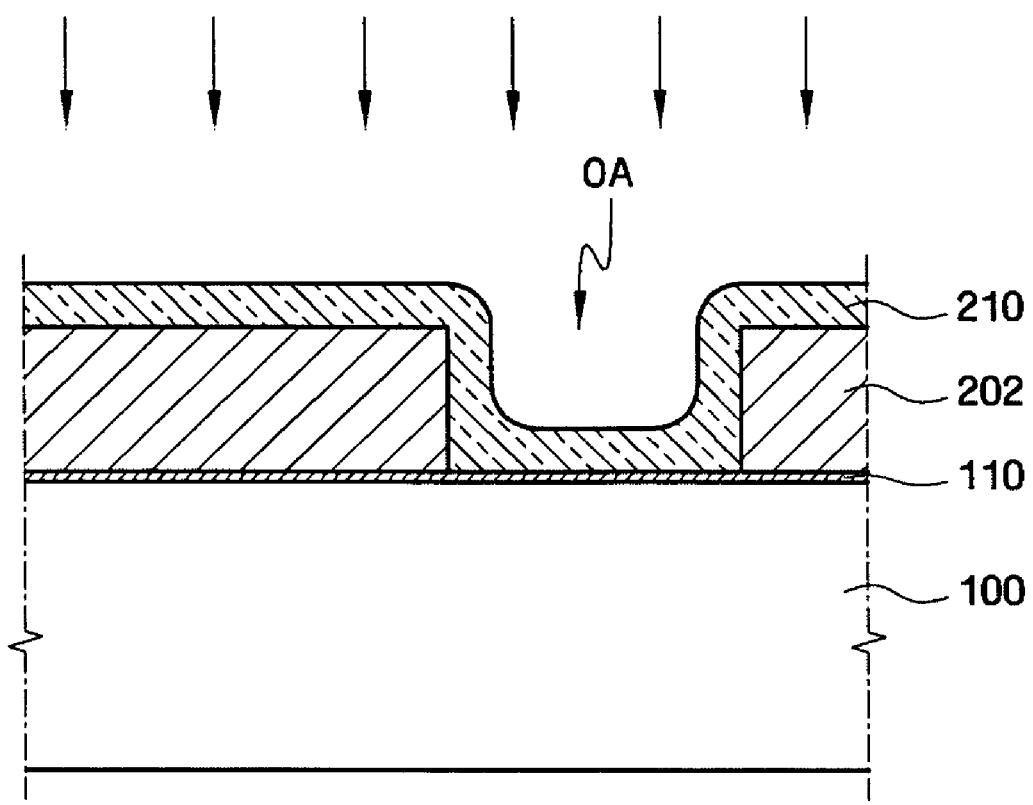

Referring to FIG. 6, a sacrificial spacer film 210 may be formed on the resulting structure of FIG. 5. The sacrificial spacer film 210 may be formed to have a conformal or substantially conformal surface structure corresponding to an upper boundary of the resulting structure of FIG. 5. More specifically, e.g., the sacrificial spacerfilm 210 located directly on the sacrificial film 202 and the sacrificial spacer film 210 located directly on the first gate insulating film 110 inside the opening OA may have almost a same thickness, but the sacrificial spacer film 210 may have a relatively larger thickness along a structural step adjacent to a lateral surface 202a of the sacrificial film 202 at a side(s) of the opening OA.

The sacrificial spacer film 210 may cover a surface of the opening OA, but may not entirely fill the opening OA. In some embodiments of the invention, a thickness of a portion of the sacrificial spacer film 210 located directly on the sacrificial film 202 may be smaller than a thickness of a portion of the sacrificial film 202 located within the opening OA, as shown in FIG. 6. In some embodiments of the invention, the sacrificial spacer film 210 may completely fill the opening OA.

The sacrificial spacer film 210 is not limited thereto, but may be formed of a same material as the sacrificial film 202 so as to be easily removed together with the sacrificial film 202 in a subsequent process. The sacrificial spacer film 210 may be formed, e.g., any one of the above-described methods of forming the sacrificial film 202.

Next, the sacrificial spacer film 210 formed over a surface, e.g., entire surface, of the semiconductor substrate 100 may be etched-back. Arrows shown in FIG. 6 schematically illustrate an etch-back process.

Figure 7:
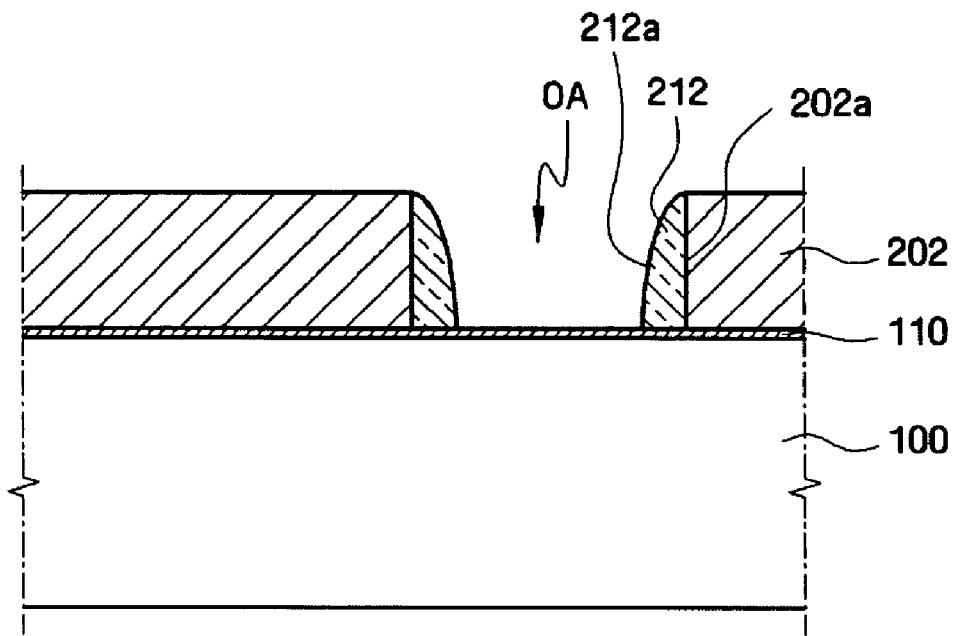

As a result of the etch-back process, as shown in FIG. 7, a sacrificial spacer 212 may be formed at the lateral surface 202a of the sacrificial film 202 at the opening OA side.

A lateral surface 212a of the sacrificial spacer 212 at the side of the opening OA may be formed to have a convex shape. In embodiments of the invention, an inclination angle formed between an upper portion of the lateral surface 212a of the sacrificial spacer 212 and the semiconductor substrate 100 may be smaller than an inclination angle formed between a lower portion of the lateral surface 212a of the sacrificial spacer 212 and the semiconductor substrate 100. An inclination angle formed between the lower portion of the lateral surface 212a of the sacrificial spacer 212 and the semiconductor substrate 100 may be, e.g., about 90°.

Because a shape of the sacrificial spacer 212 may define a shape of a lateral surface, e.g., 132_1, 132a_1, to 132d_1, of the floating gate electrode 132 that may be formed in a subsequent process, the sacrificial spacer 212 may have various shapes corresponding to the shape of the lateral surface of the floating gate electrode 132 to be formed. In some embodiments of the invention, the lateral surface 212a of the sacrificial spacer 212 that may be formed by, e.g., the etch-back process may be formed, e.g., to have a convex curved shape, as taken as a whole, and may have a shape in which a radius of curvature at the upper side thereof is smaller than a radius of curvature at a lower side thereof, or a shape including a convex curved section at the upper side thereof and a straight section at the lower side thereof.

Figure 8:
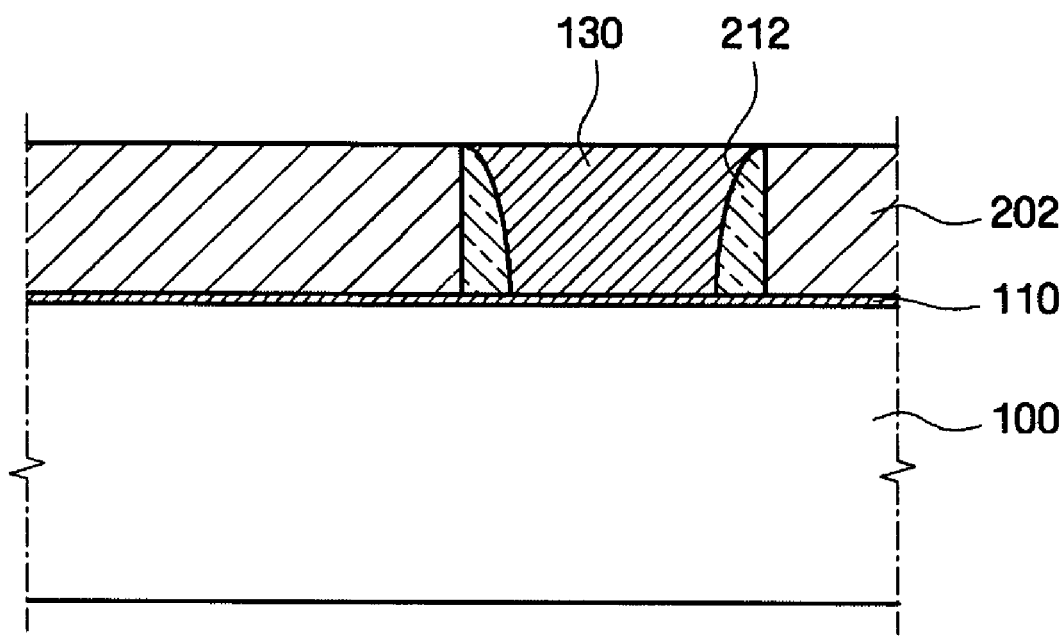

Referring to FIG. 8, a floating gate conductive film 130 may be formed inside the opening OA in which the sacrificial spacer 212 is formed. More specifically, a floating gate conductive film layer (not shown) may be formed on, e.g., an entire surface of the resulting structure of FIG. 7 by, e.g., a LPCVD method, an Atomic Layer Deposition (ALD) method, a Physical Vapor Deposition (PVD) method, a Metal Organic CVD (MOCVD) method, etc. The floating gate conductive film layer may be planarized by a Chemical Mechanical Polishing (CMP) process to form the floating gate conductive film 130 embedded inside the opening OA in which the sacrificial spacer 212 is formed.

Figure 9:
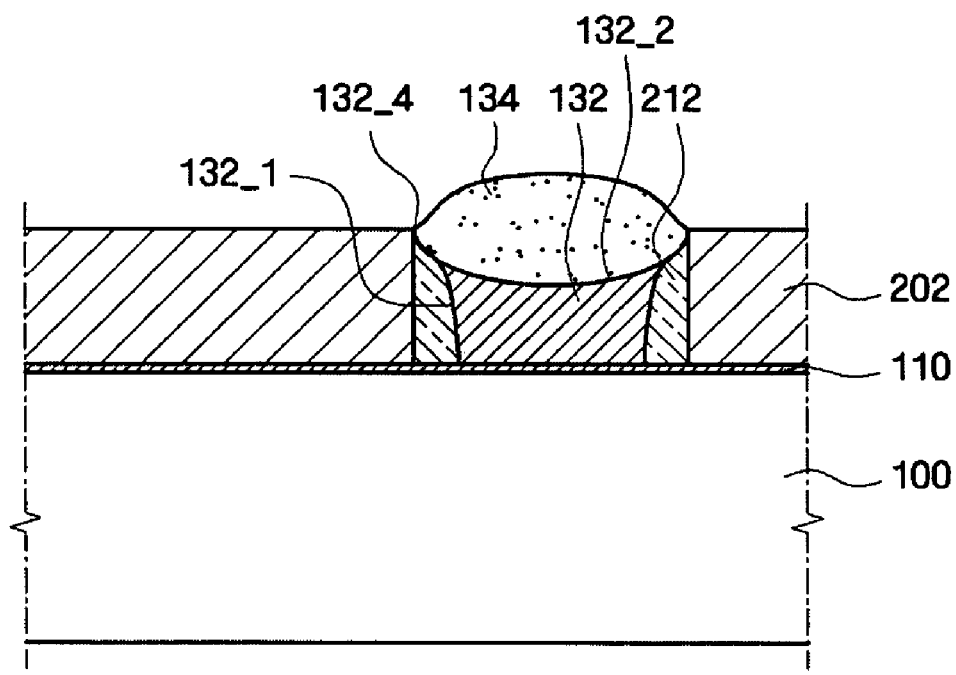

Referring to FIG. 9, an upper surface of the floating gate conductive film 130 may be oxidized to form an isolation oxide film 134. In some embodiments in which the floating gate conductive film 130 is formed of a silicon oxide film, the isolation oxide film 134 may be formed of silicon oxide using, e.g., thermal oxidation. In some embodiments in which thermal oxidation is used, the isolation oxide film 134 may be formed so as to vertically inflate from the upper surface of the floating gate conductive film 130.

Both ends of the isolation oxide film 134 where an upper surface thereof meets a lower surface thereof may have a tapered structure. Further, because thermal oxidation may only be performed in a region where the floating gate conductive film 130 is formed, a distance between both ends of the isolation oxide film 134, i.e., a width of the isolation oxide film 134 may not surpass a maximum width of the opening OA. That is, in embodiments of the invention, the width of the isolation oxide film 134 may be easily controlled.

As a result of forming the isolation oxide film 134, the upper surface of the floating gate conductive film 130 may be relatively recessed to have a concave shape. Thus, formation of the floating gate electrode 132 having a concave shape, taken as a whole, except for a lower surface thereof may be complete. As shown in FIG. 9, the acute-angled tip 132_4 may be formed at both edges of the upper surface 132_2 of the floating gate electrode 132 where the respective concave lateral surface 132_1 meets the concave upper surface 132_2.

The shape of the floating gate electrode 132 may be substantially completed in this step, and may not change as a result of subsequent processing. Therefore, in some embodiments of the invention, the entire shape of the floating gate electrode 132 may be defined by the shape of the above-described opening OA, and the shape of the sacrificial spacer 212 may define the shape of the lateral surface, e.g., 132_1, and/or the process of forming the isolation oxide film 134 may define the shape of the upper surface 132_2. Therefore, the maximum width in the transverse direction of the floating gate electrode 132 may not surpass the width of the opening OA. Therefore, if the width of the initial opening OA is accurately controlled, it is possible to prevent the floating gate electrode 132 from increasing in width. That is, because the width of the floating gate electrode 132 can be easily controlled, it is possible to easily prevent bridges that may be formed between the floating gate electrodes 132 of adjacent cells.

In addition, while forming the floating gate electrode 132, the first gate insulating film 110 and/or the semiconductor substrate 100 of regions except for the region where the opening OA is formed may be protected by the sacrificial film 202, so that it is possible to minimize damage to them.

Figure 10:
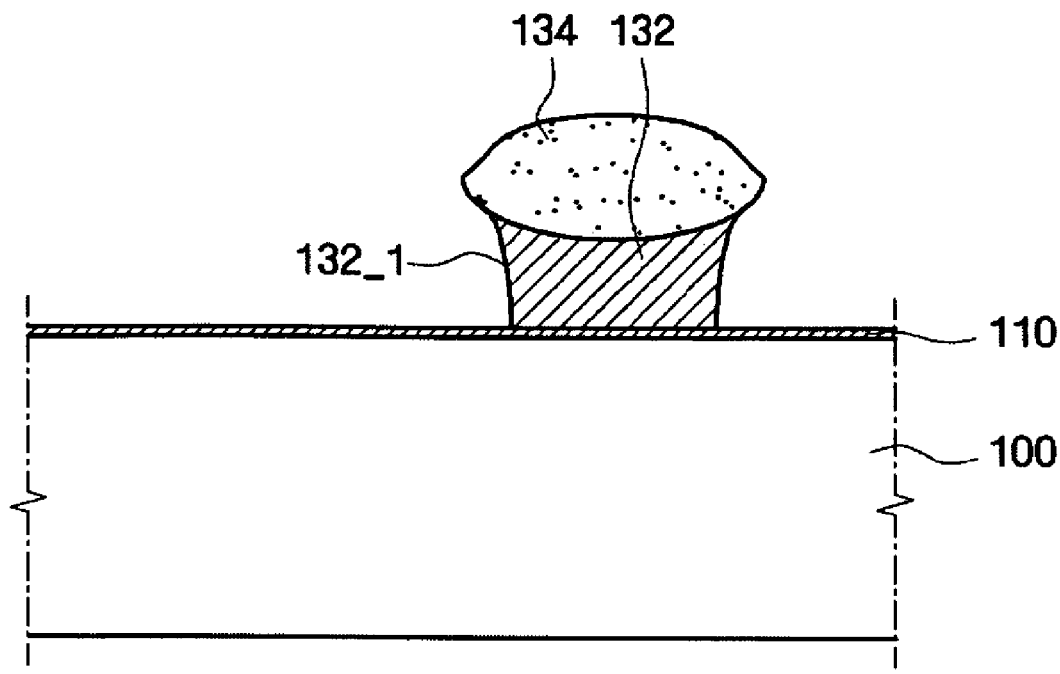

Referring to FIG. 10, the sacrificial film 202 and the sacrificial spacer 212 may be removed. The sacrificial film 202 and the sacrificial spacer 212 may be removed at the same time. For example, if the sacrificial film 202 and the sacrificial spacer 212 are formed of the same material, they may be removed at the same time.

In some embodiments of the invention, care may be taken while removing the sacrificial film 202 and the sacrificial spacer 212 such that the isolation oxide film 134 and the floating gate electrode 132 may maintain their shape. In such embodiments, e.g., the removal may be performed by, e.g., a wet etching process using etching liquid having a sufficient etching selection ratio.

Figure 11:
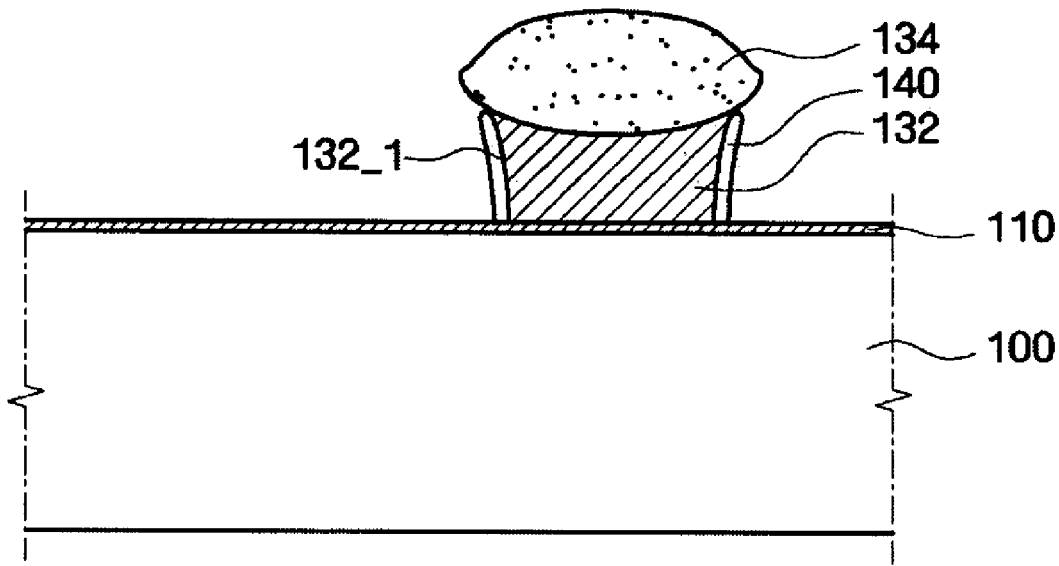

Referring to FIG. 11, the second gate insulating film 140 may be formed on an exposed surface of the floating gate electrode 132, e.g., the lateral surface 132_1 thereof. The second gate insulating film 140 may be formed, e.g., by thermal oxidation.

Figure 12:
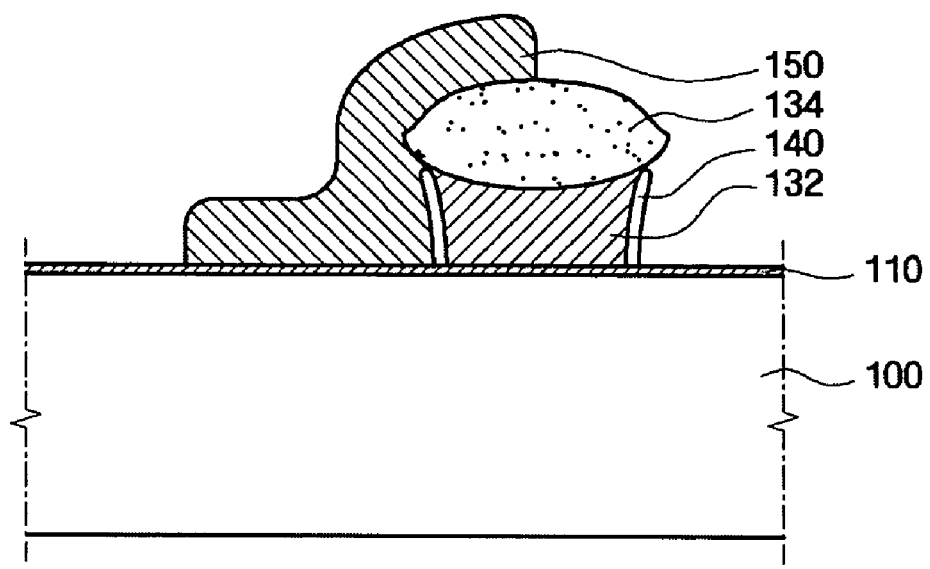

Referring to FIG. 12, a control gate conductive film (not shown) may be formed on the resulting structure of FIG. 11. The control gate conductive film may be patterned to form the control gate electrode 150.

Next, referring back to FIG. 1, the source/drain regions 102 and 104 may be formed by doping n-type impurities or p-type impurities in the semiconductor substrate 100.

Hereinafter, a method of fabricating a nonvolatile memory device according to a second exemplary embodiment of the invention will be described with reference to FIGS. 13 to 16. FIGS. 13 to 16 illustrate cross-sectional views of resulting structures obtained during an exemplary method of fabricating a nonvolatile memory device according to another embodiment of the invention. The second embodiment is different from the first exemplary embodiment illustrated in FIGS. 4 to 12 in that a mask film is used when forming an opening. In the following description, in general, only differences between the first and second exemplary embodiments will be described.

Figure 13:
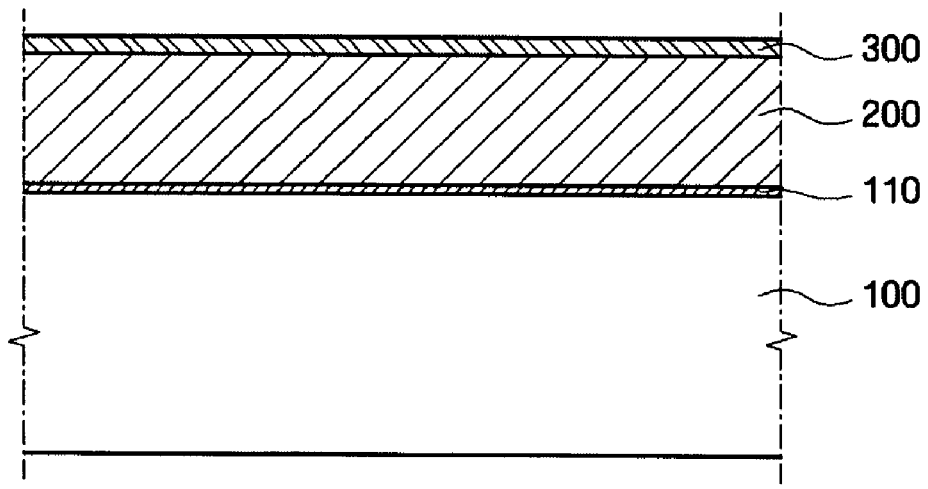
FIGS. 13 to 16 illustrate cross-sectional views of resulting structures obtained during an exemplary method of fabricating a nonvolatile memory device according to another embodiment of the invention.

More specifically, as shown in FIG. 13, in second exemplary embodiment, the first gate insulating film 110 and the sacrificial film 200 may be consecutively formed on the semiconductor substrate 100, and a mask film 300 may be further formed thereon.

The mask film 300 may protect the sacrificial film 200 from damage that may occur thereto during subsequent processing, e.g., while forming a sacrificial spacer in a subsequent process. Thus, the mask film 300 may be formed of material having a higher etching selection ratio than the sacrificial film 200. For example, the mask film 300 may be formed of polysilicon film, but is not limited thereto.

Figure 14:
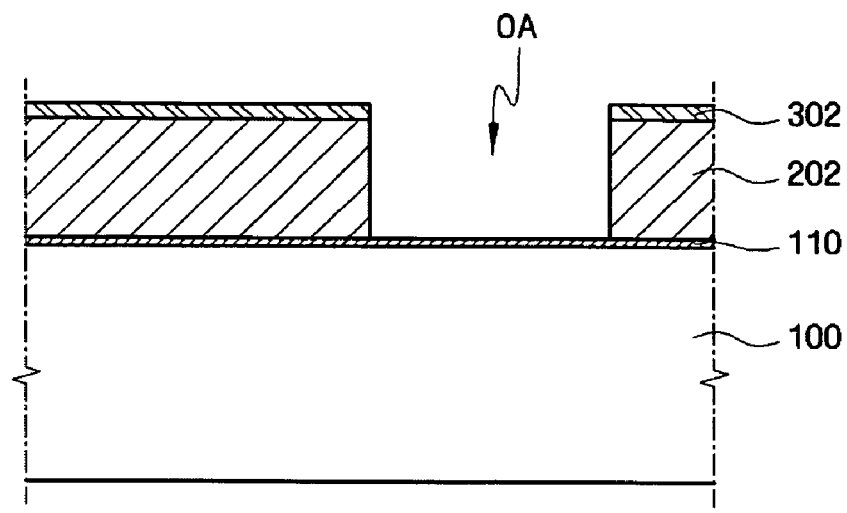

Referring to FIG. 14, the mask film 300 and the sacrificial film 200 may be patterned using, e.g., a photolithography process. The patterned mask film 302 and the sacrificial film 202 may share the opening OA through which the first gate insulating film 110 may be exposed.

Figure 15:
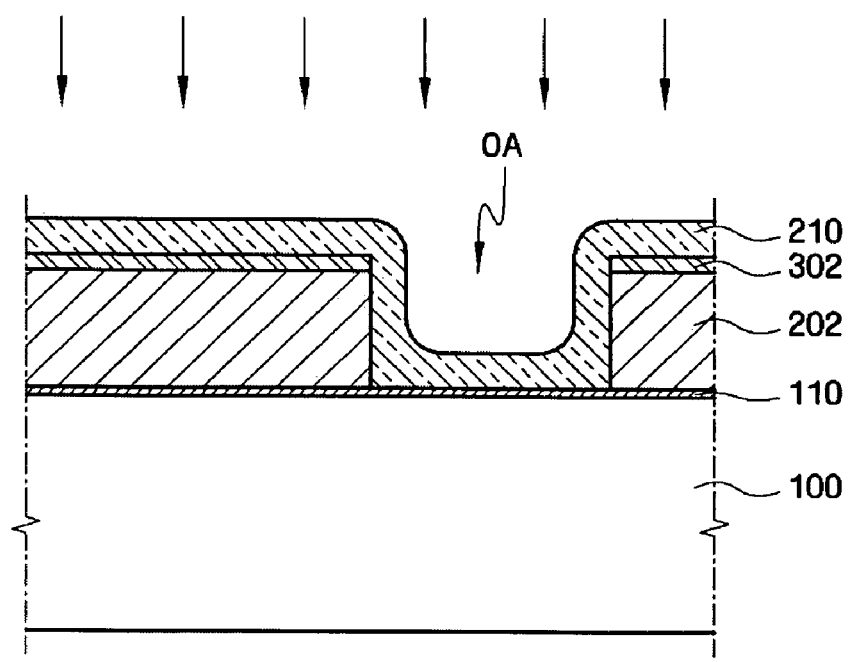

Referring to FIG. 15, the sacrificial spacer film 210 may be formed on the resulting structure of FIG. 14. This step is different from the step illustrated in FIG. 6 in that the sacrificial spacer film 210 may be formed on the mask film 302. That is, in some embodiments of the invention, e.g., the sacrificial spacer film 210 may be formed directly on, e.g., an upper surface and lateral sides of, the sacrificial film 202, while in other embodiments of the invention, e.g., the sacrificial spacer film 210 may not be formed directly on the sacrificial film 202. In other embodiments of the invention, as illustrated in FIG. 15, e.g., the sacrificial spacer film 212 may not be formed directly on an upper surface of the sacrificial film 202, but may be formed directly adjacent to lateral sides of the sacrificial film 202.

Figure 16:
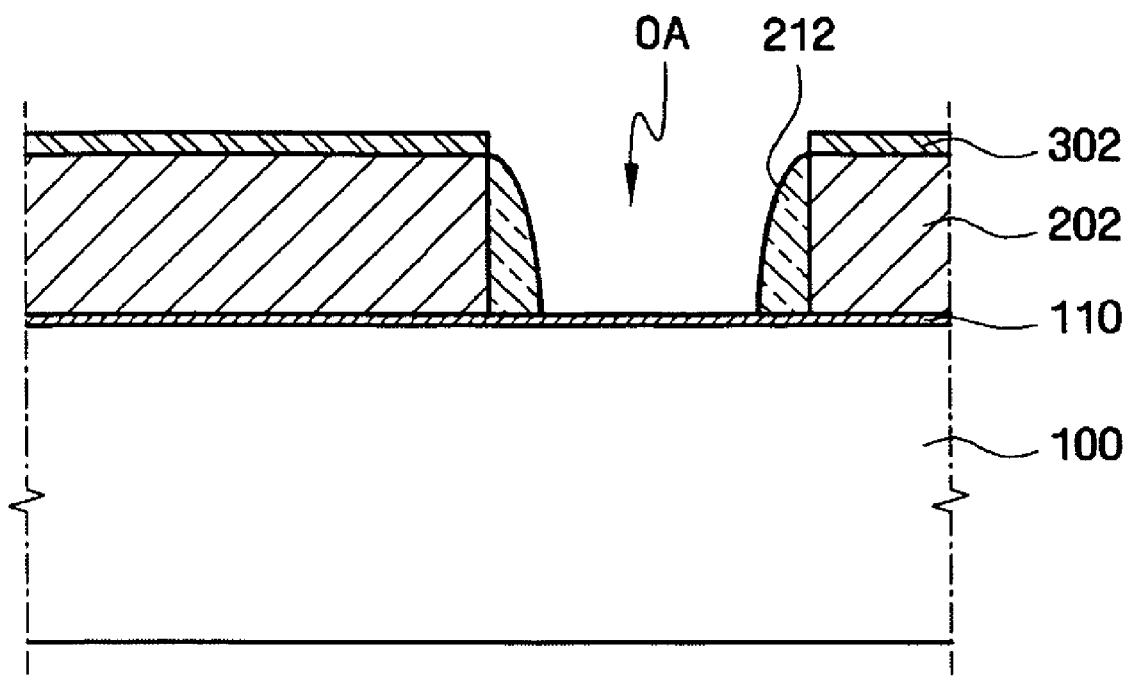

Referring to FIG. 16, the sacrificial spacer 212 may be formed on the lateral surface of the sacrificial film 202 at a side(s) of the opening OA by performing, e.g., an etch-back process. The sacrificial spacer 212 may be formed to have a same height as that of the sacrificial film 202.

The mask film 302 may prevent the sacrificial film 202 from being damaged, e.g., attacked by etch-back gas. If the mask film 302 has a smaller etching selection ratio with respect to the etch-back gas, a surface of the mask film 302 may be hardly attacked, and may remain substantially or completely planarized. As a result, a height of the sacrificial spacer 212 may be easily controlled. As the sacrificial film 202 may be excessively recessed during processing, in embodiments of the invention that provide the mask film 302, it is possible to prevent, e.g., conductive material, e.g., floating gate conductive film 130, from unintentionally remaining in, e.g., a recessed region other than the intended recessed region(s), e.g., opening OA, during, e.g., a subsequent chemical mechanical planarization.

Next, as described above with reference to FIG. 8, the floating gate conductive film 130 may be formed inside of the opening OA where the sacrificial spacer 212 may be formed. If the surface of the mask film 302 remains planarized, it is possible to prevent the floating gate conductive film 130 from remaining in a region except for the opening OA. The mask film 302 may also be removed in a subsequently performed chemical mechanical planarization. Subsequent processing may be the same as the processes described with reference to FIGS. 9 to 12, and FIG. 1, and thus, description thereof will be omitted.

Embodiments of a memory device employing one or more aspects of the present invention may provide a floating gate electrode that may include an upper tip having a smaller inner angle, thereby enabling high data erasing efficiency. Embodiments of a memory device employing one or more aspects of the invention may separately provide a lower portion of a lateral surface of the floating gate electrode that forms a large inclination angle with respect to a semiconductor substrate, thereby preventing reverse tunneling.

Embodiments of a method of manufacturing a memory device employing one or more aspects of the invention may enable a maximum width of a floating gate electrode to be easily controlled. Embodiments of a method of manufacturing a memory device employing one or more aspects of the invention may easily prevent bridges from being formed between floating electrodes of adjacent cells.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a nonvolatile memory device, the method comprising:
 forming a floating gate electrode on a semiconductor substrate, the floating gate electrode including an acute-angled tip at an upper end; and
 forming a control gate electrode insulated from the floating gate electrode, and facing at least a portion of the floating gate electrode, an angle formed between the semiconductor substrate and an upper portion of a lateral surface of the floating gate electrode being smaller than an angle formed between the semiconductor substrate and a lower portion of the lateral surface of the floating gate electrode, wherein forming the floating gate electrode includes:
- forming a stacked structure with a sacrificial film and a mask film, the stacked structure having an opening on the semiconductor substrate;
- forming a sacrificial spacer film on the stacked structure having the opening and the semiconductor substrate, the sacrificial spacer film and the sacrificial film being formed of a same material;
- forming a sacrificial spacer on a side of the opening by etching the sacrificial spacer film while the mask film protects the sacrificial film;
- forming a floating gate conductive film inside the opening where the sacrificial spacer is formed, the mask film being removed after forming the floating gate conductive film inside the opening; and
- removing the sacrificial film and the sacrificial spacer.

2. The method as claimed in claim 1, wherein the lateral surface of the floating gate electrode includes a straight section at the upper portion thereof and a concave curved section at the lower portion thereof.

3. The method as claimed in claim 1, wherein the lateral surface of the floating gate electrode includes a first straight section at the upper portion thereof and a second straight section at the lower portion thereof.

4. The method as claimed in claim 1, wherein the lower portion of the lateral surface of the floating gate electrode is recessed inward with respect to the acute-angled tip.

5. The method as claimed in claim 1, wherein:
- a lateral surface of the sacrificial spacer is formed in a convex curved shape, and a radius of curvature of an upper portion of the lateral surface of the sacrificial spacer is smaller than a radius of curvature of a lower portion of the lateral surface thereof; and
- the lateral surface of the floating gate electrode is formed in a concave curved shape, and a radius of curvature of the upper portion of the lateral surface of the floating gate electrode is smaller than a radius of curvature of the lower portion of the lateral surface of the floating gate electrode.

6. The method as claimed in claim 1, wherein:
- a lateral surface of the sacrificial spacer includes a convex curved section at the upper portion thereof and a straight section at the lower portion thereof; and
- the lateral surface of the floating gate electrode includes a concave curved section at the upper portion thereof and a straight section at the lower portion thereof.

7. The method as claimed in claim 1, wherein:
- an angle formed between the semiconductor substrate and the lower portion of a lateral surface of the sacrificial spacer is about 90°; and
- an angle formed between the semiconductor substrate and the lower portion of the lateral surface of the floating gate electrode is about 90°.

8. The method as claimed in claim 1, wherein:
- the sacrificial spacer includes a silicon nitride film; and
- the mask film includes polysilicon.

9. The method as claimed in claim 1, further comprising oxidizing an upper surface of the floating gate conductive film formed inside the opening.

10. The method as claimed in claim 9, further comprising:
- forming a first gate insulating film on the semiconductor substrate before forming the floating gate electrode; and
- forming a second gate insulating film on an exposed lateral surface of the floating gate electrode after forming the floating gate electrode.

11. The method as claimed in claim 1, wherein removing the sacrificial film and the sacrificial spacer comprises performing a wet etching method.

12. A method of fabricating a nonvolatile memory device, the method comprising:
- forming a floating gate electrode on a semiconductor substrate, the floating gate electrode including an acute-angled tip at an upper end; and
- forming a control gate electrode insulated from the floating gate electrode, and facing at least a portion of the floating gate electrode, an angle formed between the semiconductor substrate and an upper portion of a lateral surface of the floating gate electrode being smaller than an angle formed between the semiconductor substrate and a lower portion of the lateral surface of the floating gate electrode, wherein forming the floating gate electrode includes:
- forming a stacked structure with a sacrificial film and a mask film, the stacked structure having an opening on the semiconductor substrate;
- forming a sacrificial spacer film on the stacked structure having the opening and the semiconductor substrate;
- forming a sacrificial spacer on a side of the opening by etching the sacrificial spacer film while the mask film protects the sacrificial film;
- forming a floating gate conductive film inside the opening where the sacrificial spacer is formed, the mask film being removed after forming the floating gate conductive film inside the opening; and
- removing the sacrificial film and the sacrificial spacer.

13. The method as claimed in claim 12, wherein:
- the mask film is formed directly on the sacrificial film and covers the sacrificial film, and
- the mask film has a smaller etching selection ratio than the sacrificial spacer film with respect to an etch-back gas used in forming the sacrificial spacer.

* * * * *